(12) United States Patent
Liu et al.

(10) Patent No.: US 11,682,558 B2
(45) Date of Patent: Jun. 20, 2023

(54) FABRICATION OF BACK-END-OF-LINE INTERCONNECTS

(71) Applicant: International Business Machines Corporation, Armonk, NY (US)

(72) Inventors: Chi-Chun Liu, Altamont, NY (US); Ashim Dutta, Clifton Park, NY (US); Nelson Felix, Slingerlands, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/481,981

(22) Filed: Sep. 22, 2021

(65) Prior Publication Data

US 2023/0096938 A1 Mar. 30, 2023

(51) Int. Cl.
*H01L 21/311* (2006.01)
*H01L 21/033* (2006.01)

(52) U.S. Cl.
CPC .... *H01L 21/0337* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 9,748,110 B2 | 8/2017 | Kal et al. | |
| 9,773,676 B2 | 9/2017 | Chang et al. | |
| 9,779,944 B1 * | 10/2017 | Burns | H01L 21/0337 |
| 9,786,503 B2 | 10/2017 | Raley et al. | |
| 9,799,534 B1 | 10/2017 | Arceo de la Pena et al. | |
| 9,934,970 B1 * | 4/2018 | Burns | H01L 21/0337 |
| 10,163,633 B2 | 12/2018 | Law et al. | |
| 10,249,496 B2 | 4/2019 | Shu et al. | |
| 10,256,320 B1 * | 4/2019 | Liu | H01L 29/6653 |
| 10,354,873 B2 | 7/2019 | Ko et al. | |
| 2018/0145145 A1 * | 5/2018 | Chen | H01L 21/0337 |
| 2018/0315602 A1 * | 11/2018 | Tseng | H01L 29/66795 |
| 2019/0189444 A1 | 6/2019 | Sun et al. | |
| 2019/0237341 A1 * | 8/2019 | Yu | H01L 21/32136 |
| 2019/0318968 A1 | 10/2019 | Seo et al. | |
| 2019/0348296 A1 | 11/2019 | Sherpa et al. | |
| 2021/0143013 A1 | 5/2021 | Liu et al. | |
| 2022/0093414 A1 * | 3/2022 | Penny | H01L 21/32139 |

* cited by examiner

*Primary Examiner* — Shamim Ahmed
(74) *Attorney, Agent, or Firm* — Samuel Waldbaum; Ryan, Mason & Lewis, LLP

(57) ABSTRACT

A semiconductor structure includes a set of mandrel lines and a set of non-mandrel lines disposed on a hardmask in an alternating pattern. Spacers are disposed between adjacent mandrel lines and non-mandrel lines. The spacers include a composition which exhibits an etch rate greater than an etch rate of the mandrel lines and the non-mandrel lines.

20 Claims, 4 Drawing Sheets

FABRICATION OF BACK-END-OF-LINE INTERCONNECTS

BACKGROUND

With the current trends in integrated circuit (IC) miniaturization, and increasingly smaller critical dimensions, it is desirable in semiconductor device technology to integrate many different functions on a single chip. Back-end-of-line (BEOL) is the second portion of IC fabrication where the individual devices (e.g., transistors, capacitors, resistors, etc.) get interconnected with wiring on the wafer, i.e., the metallization layer. Common metals are copper interconnects and aluminum interconnects. BEOL generally begins when the first layer of metal is deposited on the wafer. BEOL includes contacts, insulating layers (dielectrics), metal levels, and bonding sites for chip-to-package connections.

SUMMARY

Illustrative embodiments provide semiconductor techniques for fabricating BEOL interconnects.

According to an exemplary embodiment, a semiconductor structure comprises a set of mandrel lines and a set of non-mandrel lines disposed on a hardmask in an alternating pattern. The semiconductor structure further comprises spacers disposed between adjacent mandrel lines and non-mandrel lines. The spacers comprise a composition which exhibits an etch rate greater than an etch rate of the mandrel lines and the non-mandrel lines.

According to an exemplary embodiment, a method comprises selectively removing spacers disposed between mandrel lines and non-mandrel lines on a hardmask. An etch rate of the spacers is greater than an etch rate of the mandrel lines and the non-mandrel lines.

According to an exemplary embodiment, a method comprises forming a set of mandrel lines on a hardmask. The method further comprises forming spacers on sidewalls of the mandrel lines and on the hardmask. The method further comprises forming a set of non-mandrel lines between respective adjacent spacers and on the hardmask. The method further comprises selectively removing the spacers relative to the set of mandrels and the set of non-mandrel lines. An etch rate of the spacers is greater than an etch rate of the mandrel lines and the non-mandrel lines.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1:
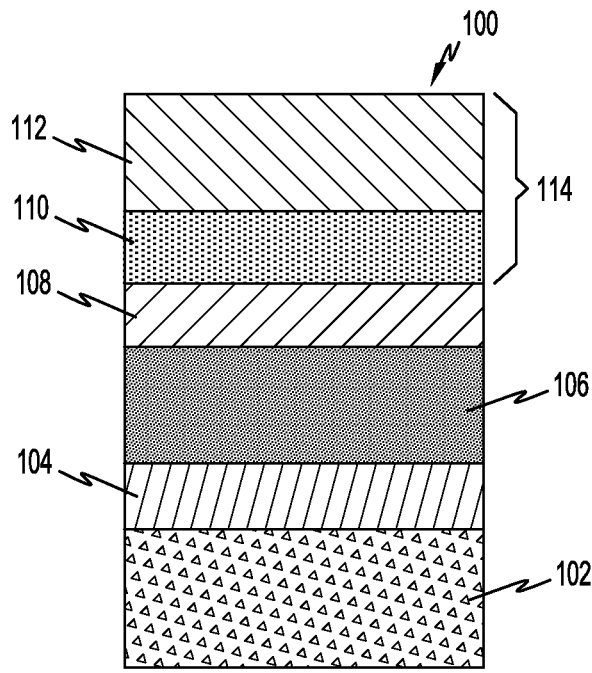
FIG. 1 is a cross-sectional view of a semiconductor structure at a first-intermediate fabrication stage, according to an illustrative embodiment.

This disclosure relates generally to semiconductor devices, and more particularly to BEOL interconnects and methods for their fabrication. Exemplary embodiments will now be discussed in further detail with regard to semiconductor devices and methods of manufacturing same and, in particular, to BEOL interconnects and methods for their fabrication.

In the general manufacturing scheme of an IC, there are two major parts, the front-end-of-line (FEOL) processing and the back-end-of-line (BEOL) processing. The FEOL layer contains active and nonlinear devices requiring a semiconductor, such as transistors, diodes, varactors, photodetectors, photo-emitters, polysilicon resistors, MOS (metal-oxide-silicon or metal-oxide-semiconductor) capacitors, waveguides, waveguide modulators, etc. as mentioned above, the BEOL contains passive, linear devices made from metals and insulators, such as signal and power wires, transmission lines, metal resistors, metal-insulator-metal (MIM) capacitors, inductors, fuses, etc. The FEOL processing may include a transistor and other active or nonlinear devices being formed on a semiconducting wafer surface, for example a Si wafer, and the BEOL may include the devices being wired together with a patterned multilevel metallization process.

To support the increased component density, a hierarchical wiring method was developed for the BEOL, in which multiple levels of interconnect wires are fabricated in a level-by-level scheme. The BEOL then generally includes a plurality of wiring levels to provide interconnections for the FEOL devices to carry the signals therebetween. A set of far BEOL (FBEOL) connections is formed, and the IC is then finally protected by a sealing layer.

To fabricate the BEOL interconnect layers, a damascene or dual damascene process is commonly used and is known in the art. The dual damascene process allows for hierarchical wiring management and reduced cost. There is a need for defining the right material set to enable the different schemes for multi patterning of BEOL interconnects.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Referring now to the drawings in which like numerals represent the same of similar elements, FIGS. 1-9 illustrate various processes for fabricating BEOL interconnects. Note that the same reference numeral (100) is used to denote the semiconductor structure through the various intermediate fabrication stages illustrated in FIGS. 1-9. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1-9 are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

FIG. 1 is a cross-sectional view of a semiconductor structure at the first-intermediate fabrication stage. Semiconductor device 100 includes a layer 102 that requires patterning. Layer 102 may be a metallic layer (e.g., aluminum, ruthenium, molybdenum, and the like), a dielectric layer, a polymer layer, a substrate (e.g., silicon), or any other layer of a semiconductor device that may be patterned using photolithography and etching techniques. A hardmask 104 is disposed over layer 102. Hardmask 104 may be formed of any suitable material such as, for example, silicon oxynitride (SiON), silicon nitride ($Si_3N_4$), SiBCN, SiNC, SiN, SiCO, $SiO_2$, SiNOC, amorphous Si, and titanium nitride (TiN) and the like. Hardmask 104 may be deposited by conventional techniques such as chemical vapor deposition (CVD), low pressure CVD, plasma enhanced CVD, plasma enhanced ALD, PVD, and the like. Layer 102 and hardmask 104 can be planarized using a planarization process, such as, for example, chemical mechanical planarization (CMP), if needed.

In subsequent processing steps, a pattern is transferred onto hardmask 104 using various photolithography and etching techniques. Hardmask 104 may then be used as a patterning mask for etching underlying layer 102.

A layer 106 is disposed over hardmask 104. Layer 106 can be etched to form mandrel lines for the formation of sidewall aligned spacers in, for example, multiple pattern lithography. Suitable material for layer 106 includes, for example, a polymer, an ashable hardmask (e.g., amorphous carbon film or amorphous silicon film), polysilicon, or any other material that may be patterned. In one embodiment, layer 106 is amorphous silicon or silicon nitride.

A bi-layer photoresist 114 may be formed over a dielectric hardmask layer 108. Dielectric hardmask layer 108 may comprise a hardmask material such as, for example, a nitride (e.g., SiON). Bi-layer photoresist 114 can include a top photoresist layer 112, and a bottom layer 110, which may include anti-reflective materials (e.g., a bottom anti-reflective coating (BARC) layer) to aid the exposure and focus of the top photoresist layer 112's processing. In another embodiment, layers 112, 110, and 108 could be a photoresist, silicon oxide hardmask, and spin-on carbon, also known as optical planarization layer (OPL), respectively.

Figure 2:
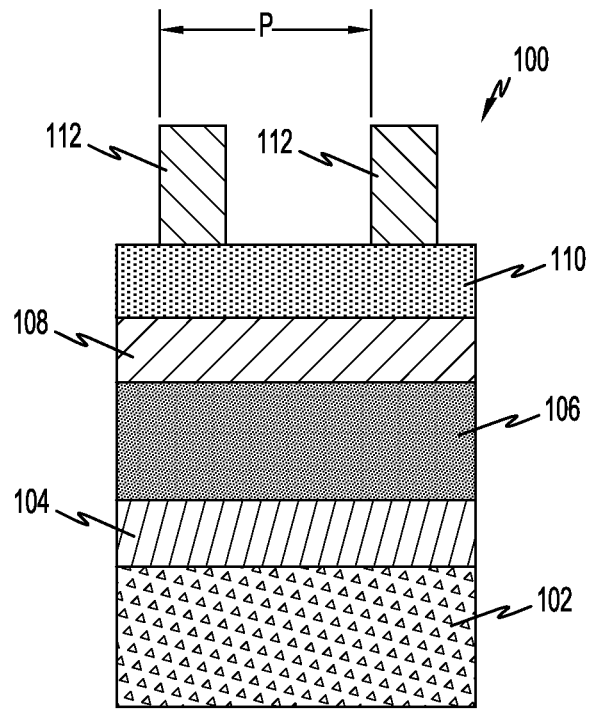
FIG. 2 is a cross-sectional view illustrating the semiconductor structure at a second-intermediate fabrication stage, according to an illustrative embodiment.

FIG. 2 illustrates a cross-sectional view of semiconductor structure 100 at the second-intermediate fabrication stage. During this stage, top photoresist layer 112 is patterned using any suitable photolithography technique. For example, a photomask (not shown) may be disposed over top photoresist layer 112, which may then be exposed to radiation such as ultraviolet light derived from an excimer laser or extreme ultraviolet (EUV) sources. Exposure of top photoresist layer 112 may be performed using an immersion lithography system (e.g., a 193 nm immersion lithography system) to increase resolution and decrease the minimum achievable pitch. A bake or cure operation may be performed to harden top photoresist layer 112, and a developer may be used to remove either the exposed or unexposed portions of the layer 112 depending on whether a positive or negative resist is used. Thus, a pattern such as the pattern illustrated in FIG. 2 is formed in top photoresist layer 112. The patterned portions of top photoresist layer 112 may be spaced apart from each other at a pitch P. Pitch P may be a minimum pitch (i.e., the smallest pitch the photolithographic system can achieve) and may be, for example, about 30 to about 80 nm. The pattern of photoresist layer 112 in FIG. 2 is for illustrative sake only, and other patterns may be formed depending on the design of semiconductor device 100.

Figure 3:
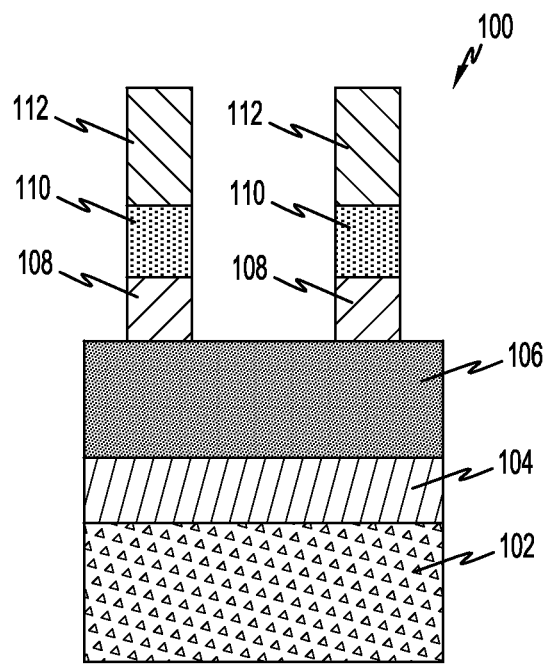
FIG. 3 is a cross-sectional view illustrating the semiconductor structure at a third-intermediate fabrication stage, according to an illustrative embodiment.

FIG. 3 illustrates a cross-sectional view of semiconductor structure 100 at the third-intermediate fabrication stage. During this stage, the pattern of top photoresist layer 112 is transferred to bottom layer 110 and dielectric hardmask layer 108, respectively. The pattern transfer may be done, for example, using a selective etching process. Subsequently, top and bottom layers 112 and 110 may be etched using, e.g., a trimming process such as an anisotropic plasma etch process. Portions of dielectric hardmask layer 108 may also be removed as part of the trimming process to achieve a more stable, aspect-ratio for subsequent etching steps.

Figure 4:
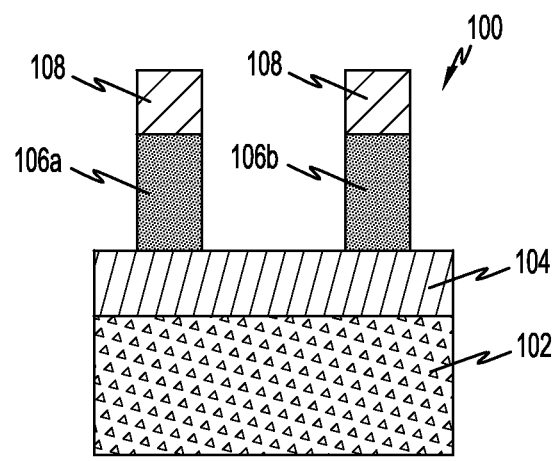
FIG. 4 is a cross-sectional view illustrating the semiconductor structure at a fourth-intermediate fabrication stage, according to an illustrative embodiment.

FIG. 4 illustrates a cross-sectional view of semiconductor structure 100 at the fourth-intermediate fabrication stage. During this stage, layer 106 may be etched using bi-layer photoresist 114 and dielectric hardmask layer 108 as a patterning mask, forming a set of mandrel lines 106a and 106b. Although the figures show two mandrel lines being formed, any number of desired mandrel lines are contemplated herein and the number of mandrel lines should not be considered limiting. Thus, a "set of mandrel lines" as used herein can be considered as including one or more mandrel lines.

Figure 5:
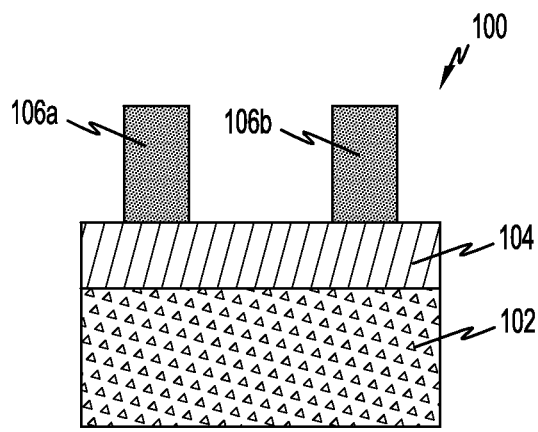
FIG. 5 is a cross-sectional view illustrating the semiconductor structure at a fifth-intermediate fabrication stage, according to an illustrative embodiment.

FIG. 5 illustrates a cross-sectional view of semiconductor structure 100 at the fifth-intermediate fabrication stage. During this stage, bi-layer photoresist 114 and dielectric hardmask layer 108 may then be removed by applying, for example, an ashing process and a wet clean process to clean the remainder of dielectric hardmask layer 108 from the patterned mandrel lines 106a and 106b. The use of bi-layer photoresist 114 and the dielectric hardmask layer 108 to pattern layer 106 allows for mandrel lines 106a and 106b to have evenly spaced, substantially rectangular profiles for the stable formation of a sidewall aligned spacer in a subsequent process step. Other techniques for patterning layer 106 may also be used.

Figure 6:
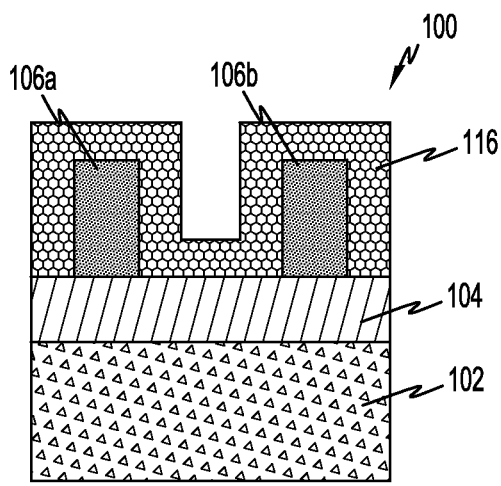
FIG. 6 is a cross-sectional view illustrating the semiconductor structure at a sixth-intermediate fabrication stage, according to an illustrative embodiment.

FIG. 6 illustrates a cross-sectional view of semiconductor structure 100 at the sixth-intermediate fabrication stage. During this stage, sidewall spacers 116 are conformally deposited over mandrel lines 106a and 106b and hardmask 104. In one embodiment, a suitable material for spacers 116 includes, for example, a metal oxide such as TiOx and TaOx. The material can be tuned to improve its removal through wet etch. For example, spacers 116 can comprise a composition exhibiting an etch rate greater than an etch rate of the mandrel lines 106a and 106b and the non-mandrel lines 118 (see, FIGS. 8 and 9). In one illustrative embodiment, spacers 116 can be a metal oxide comprising a material that includes carbon and optionally nitrogen to improve an etch removal rate of spacers 116 relative to that of mandrel lines 106a and 106b and non-mandrel lines 118 (see, FIGS. 8 and 9). In one illustrative embodiment, the carbon content of the metal oxide will play a role in the wet etch rate of spacers 116 which can enable high selectivity spacer removal (sometimes referred to as spacer pull) in a subsequent process step as described below. Accordingly, in an illustrative embodiment, an etch rate of the spacers 116 is greater than an etch rate of mandrel lines 106a and 106b and non-mandrel lines 118 (see, FIGS. 8 and 9). For example, an etch rate of the spacers 116, defined as the ratio of the etch rate of spacers 116 to the etch rate of either the mandrel lines 106a and 106b or the non-mandrel lines 118 is from about 50:1 to about 100:1. In one illustrative embodiment, three specific etch processes can be employed to etch each of the materials in mandrel lines 106a and 106b, sidewall spacers 116 and non-mandrel lines 118, while maintaining a relatively low etch rate to the other two materials and hardmask 104, if exposed to the etchant.

In one embodiment, spacers 116 can be a composition containing from about 1% to about 25% carbon content and from about 50% to about 70% metal content. In one embodiment, spacers 116 can be a composition containing from about 10% to about 25% carbon content and from about 50% to about 70% metal content. In one embodiment, the carbon content in spacers 116 decreases film density in the range of about 3 to about 3.5 g/cm$^2$ to enable wet strip in SC-1 type chemistries, such as a wet etch process comprising a mix of ammonia and hydrogen peroxide, e.g., ammonia, hydrogen peroxide and de-ionized water, while enabling spacer etch-back selective to the mandrel lines 106 and non-mandrel lines 118 (see, FIGS. 8 and 9).

Spacers 116 can be deposited using any suitable method such as atomic layer deposition (ALD). The material characteristics for wet strippability can be achieved through deposition at a temperature ranging from about 30° C. to about 80° C. and under a plasma pressure ranging from about 220 MPa to about 250 MPa. In one embodiment, a post deposition treatment with an ozone plasma can be used to increase the wet etchability.

Figure 7:
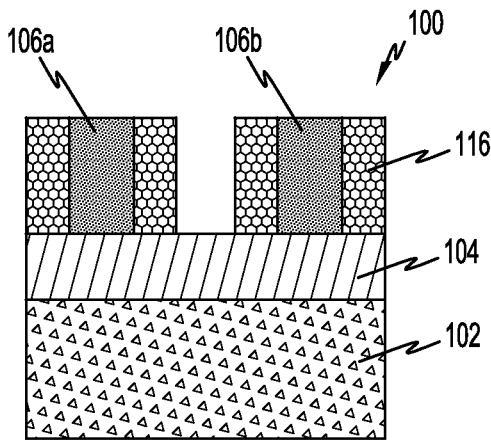
FIG. 7 is a cross-sectional view illustrating the semiconductor structure at a seventh-intermediate fabrication stage, according to an illustrative embodiment.

FIG. 7 illustrates a cross-sectional view of semiconductor structure 100 at the seventh-intermediate fabrication stage. During this stage, sometimes referred to as spacer etch-back, the horizontal portions of spacers 116 are removed, i.e., from the top surface of mandrel lines 106a and 106b and hardmask 104, exposing the top surface of hardmask 104 and leaving an opening between adjacent sidewall spaces 116 on mandrel lines 106a and 106b. The horizontal portions of spacers 116 are removed using a suitable etching process such as reactive ion etching (ME).

Figure 8:
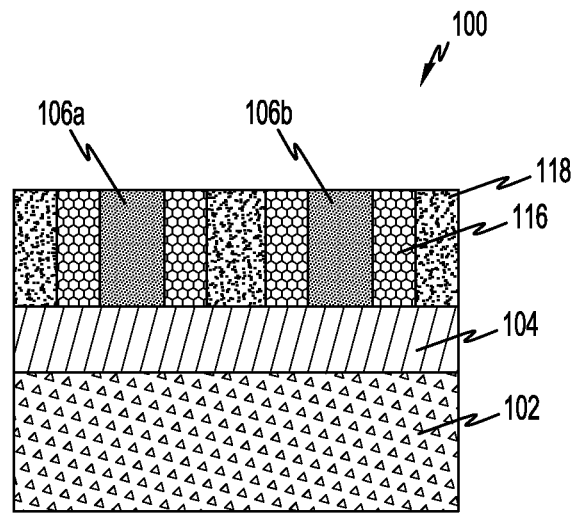
FIG. 8 is a cross-sectional view illustrating the semiconductor structure at an eighth-intermediate fabrication stage, according to an illustrative embodiment.

FIG. 8 illustrates a cross-sectional view of semiconductor structure 100 at the eighth-intermediate fabrication stage. During this stage, non-mandrel lines 118 as discussed above are deposited in the openings between adjacent spacers 116 and on top of mandrel lines 106a and 106b and spacers 116, and then followed by a planarizing CMP process to remove the overburdens. Mandrel lines 106a and 106b and non-mandrel lines 118 form an alternating pattern of non-mandrel line, mandrel line, non-mandrel line, mandrel line, non-mandrel line with spacers 116 in between each line, as shown in FIG. 8. Suitable material for non-mandrel lines 118 includes, for example, a spin-on dielectric such as a spin-on oxide, spin-on oxycarbide, spin-on oxynitride and spin-on glass (SOG). The material can be tuned depending on whether the non-mandrel material needs to be removed through wet etch or be resistant to wet etch. For example, in this embodiment, the spin-on dielectric is a silicon oxide material that includes carbon to improve the etch resistance relative to the wet removal process of spacers 116. In the same wet removal process, mandrel lines 106a and 106b also have a negligible etch rate. Maintaining the carbon content of the non-mandrel lines 118 by avoiding the commonly used UV/Ozone post-processing step of SOG will increase the wet etch resistance of the non-mandrel lines 118 to enable the spacer pull in a subsequent processing step.

In one embodiment, non-mandrel lines 118 can contain from about 1% to about 25% carbon content. In another embodiment, maintaining a carbon content in non-mandrel lines 118 enables wet resistance to SC-1 type wet chemistries while preserving dry etch selectivity to underlying hardmask 104. In another embodiment, non-mandrel lines 118 can contain greater than about 15% carbon content, e.g., from greater than about 15% to about 25% carbon content.

Figure 9:
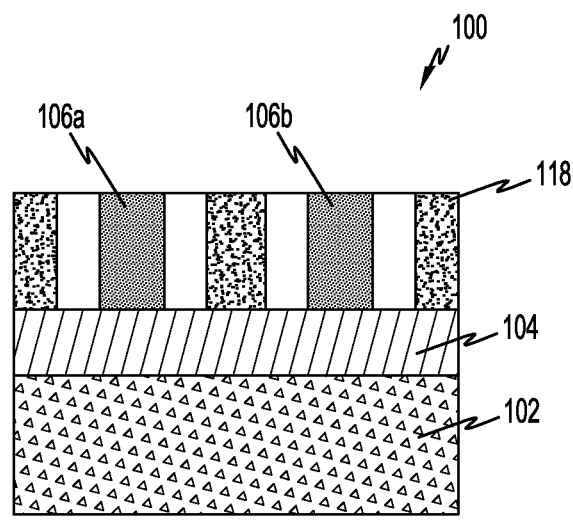
FIG. 9 is a cross-sectional view illustrating the semiconductor structure at a ninth-intermediate fabrication stage, according to an illustrative embodiment.

FIG. 9 illustrates a cross-sectional view of semiconductor structure 100 at the ninth-intermediate fabrication stage. During this stage, spacers 116 are selectively removed from semiconductor structure 100 using a selective wet etch. For example, after proper customization of mandrel and non-mandrel patterns using additional lithography and selective etch processes, the wafer will then go through a SC-1 process as described about where spacer 116 will be completely removed while any exposed layers 104, 106, and 118 will have negligible damage by the SC-1.

Following the removal of spacers 116, semiconductor structure 100 is subjected to one or more processing steps as known in the art. For example, the line patterns will be transferred to hardmask 104 and then the metal layer 102, followed by one or more lithography and etching processes to define vias, i.e., vertical connections between upper and lower metal layers. This layer of metal/via structures will then be covered by dielectric materials and planarized.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method, comprising:
   selectively removing spacers disposed between mandrel lines and non-mandrel lines on a hardmask;
   wherein an etch rate of the spacers is greater than an etch rate of the mandrel lines and the non-mandrel lines.

2. The method according to claim 1, wherein the spacers comprise a metal oxide comprising about 1% to about 25% carbon content and from about 50% to about 70% metal content.

3. The method according to claim 2, wherein the metal oxide comprises one of TiOx and TaOx.

4. The method according to claim 1, wherein the spacers comprise a metal oxide comprising about 10% to about 25% carbon content and from about 50% to about 70% metal content.

5. The method according to claim 1, wherein the spacers comprise a metal oxide comprising about 1% to about 25% carbon content and from about 50% to about 70% metal content, and the non-mandrel lines comprise a spin-on dielectric comprising about 1% to about 25% carbon content.

6. The method according to claim 1, wherein selectively removing the spacers comprises a wet etch process comprising ammonia and hydrogen peroxide.

7. A method, comprising:
   forming a set of mandrel lines on a hardmask;
   forming spacers on sidewalls of the mandrel lines and on the hardmask;
   forming a set of non-mandrel lines between respective adjacent spacers and on the hardmask; and
   selectively removing the spacers relative to the set of mandrels and the set of non-mandrel lines;
   wherein an etch rate of the spacers is greater than an etch rate of the mandrel lines and the non-mandrel lines.

8. The method according to claim 7, wherein the spacers comprise a metal oxide comprising about 1% to about 25% carbon content and from about 50% to about 70% metal content, and the non-mandrel lines comprise a spin-on dielectric comprising about 1% to about 25% carbon content.

9. The method according to claim 8, wherein the metal oxide comprises one of TiOx and TaOx.

10. The method according to claim 7, wherein the spacers comprise a metal oxide comprising about 10% to about 25% carbon content and from about 50% to about 70% metal content, and the non-mandrel lines comprise a spin-on dielectric comprising about 1% to about 25% carbon content.

11. The method according to claim 7, wherein selectively removing the spacers comprises a wet etch process comprising ammonia and hydrogen peroxide.

12. The method according to claim 7, wherein the spacers are deposited by atomic layer deposition.

13. A method, comprising:
   forming a set of mandrel lines on a hardmask;
   forming spacers on the mandrel lines and on the hardmask;
   removing horizontal portions of the spacers to expose a top surface of the mandrel lines and the hardmask;
   forming a set of non-mandrel lines between respective adjacent spacers and on the hardmask; and
   selectively removing the spacers relative to the set of mandrels and the set of non-mandrel lines;
   wherein an etch rate of the spacers is greater than an etch rate of the mandrel lines and the non-mandrel lines.

14. The method according to claim 13, wherein the composition of the spacers comprises a metal oxide comprising about 1% to about 25% carbon content and from about 50% to about 70% metal content.

15. The method according to claim 14, wherein the non-mandrel lines comprise a spin-on dielectric comprising about 1% to about 25% carbon content.

16. The method according to claim 14, wherein the metal oxide comprises one of TiOx and TaOx.

17. The method according to claim 13, wherein the mandrel lines comprise one of amorphous silicon or silicon nitride and the non-mandrel lines comprise a spin-on dielectric.

18. The method according to claim 13, wherein forming the spacers comprises atomic layer deposition.

19. The method according to claim 13, wherein the set of non-mandrel lines are resistant to wet etch processes.

20. The method according to claim 13, wherein selectively removing the spacers relative to the set of mandrels and the set of non-mandrel lines comprises a wet etch process comprising ammonia and hydrogen peroxide.

* * * * *